United States Patent [19]

Miwa et al.

[11] 4,048,478
[45] Sept. 13, 1977

[54] MARKING APPARATUS WITH ELECTRONIC COUNTERS

[75] Inventors: Akihoro Miwa, Funabashi; Shigemi Misono, Tokyo, both of Japan

[73] Assignee: Kabushiki Kaisha Daini Seikosha, Japan

[21] Appl. No.: 587,870

[22] Filed: June 18, 1975

[30] Foreign Application Priority Data

June 18, 1974 Japan .................................. 49-69509
June 22, 1974 Japan .................................. 49-71579

[51] Int. Cl.² ............................................. G06M 3/08
[52] U.S. Cl. ................................ 235/92 T; 235/92 B; 235/92 R; 58/74
[58] Field of Search ........... 235/92 T, 92 EA, 92 PC, 235/92 MS, 92 B, 92 PL; 58/74, 88 G, 39.5

[56] References Cited

U.S. PATENT DOCUMENTS

| | | | |
|---|---|---|---|
| 3,789,600 | 2/1974 | Champan | 58/74 |
| 3,808,408 | 4/1974 | Given et al. | 235/92 PK |
| 3,854,277 | 12/1974 | Samejima | 58/74 |
| 3,876,869 | 4/1975 | Houpt | 235/92 T |

*Primary Examiner*—Joseph M. Thesz
*Attorney, Agent, or Firm*—Robert E. Burns; Emmanuel J. Lobato; Bruce L. Adams

[57] ABSTRACT

A marking apparatus in the form of handy and compact writing tool can be used as a marking counter for numerals and quantities, and also used as a stop watch for measuring the time duration in athletic sports or in industrial use. These wide range of applications are enabled by an electronic circuit contained in the apparatus and comprising switches to input marking frequencies, an oscillator generating standard clock pulse signals, counters for counting output signals respectively from the switches and the oscillator, a reset switch for the counters, a toggle switch selectively connecting the marking portion and the oscillator to the counters, segment drivers decoding signals from the counters and driving indicators which display counted values of the counters as figures.

5 Claims, 4 Drawing Figures

MARKING APPARATUS WITH ELECTRONIC COUNTERS

BACKGROUND OF THE INVENTION

The invention relates to writing or marking apparatus with electronic counters, especially to compact and low priced apparatus. Conventional marking apparatus are so designed and arranged that marking frequencies are counted mechanically or by means of the combination of electronic counters and switches. However, such mechanical marking apparatus usually have very complex constructions, so that it is impossible to realize compact construction of apparatus. On the other hand, conventional apparatus including the combination of electronic counters and switches connected thereto are too large in dimension and therefore quite unsuitable for handy and compact apparatus.

The present invention aims to eliminate the above described drawbacks and provides a writing and marking apparatus with electronic counters involving an inner oscillator and being available for as a simple stop watch.

BRIEF DESCRIPTION OF THE DRAWINGS

For a more complete understanding of this invention reference may be had to the accompanying diagrams, in which.

DESCRIPTION OF THE PREFERRED EMBODIMENTS

The present marking apparatus with electronic counters have two main functions. In other words, the apparatus functions on the one hand, to count numerals, for example papers in an office, or persons through ticket collector's gates. On the other hand, it is available for measuring time duration. As to the former function, the marking mode of the said apparatus will now be explained.

Figure 1:
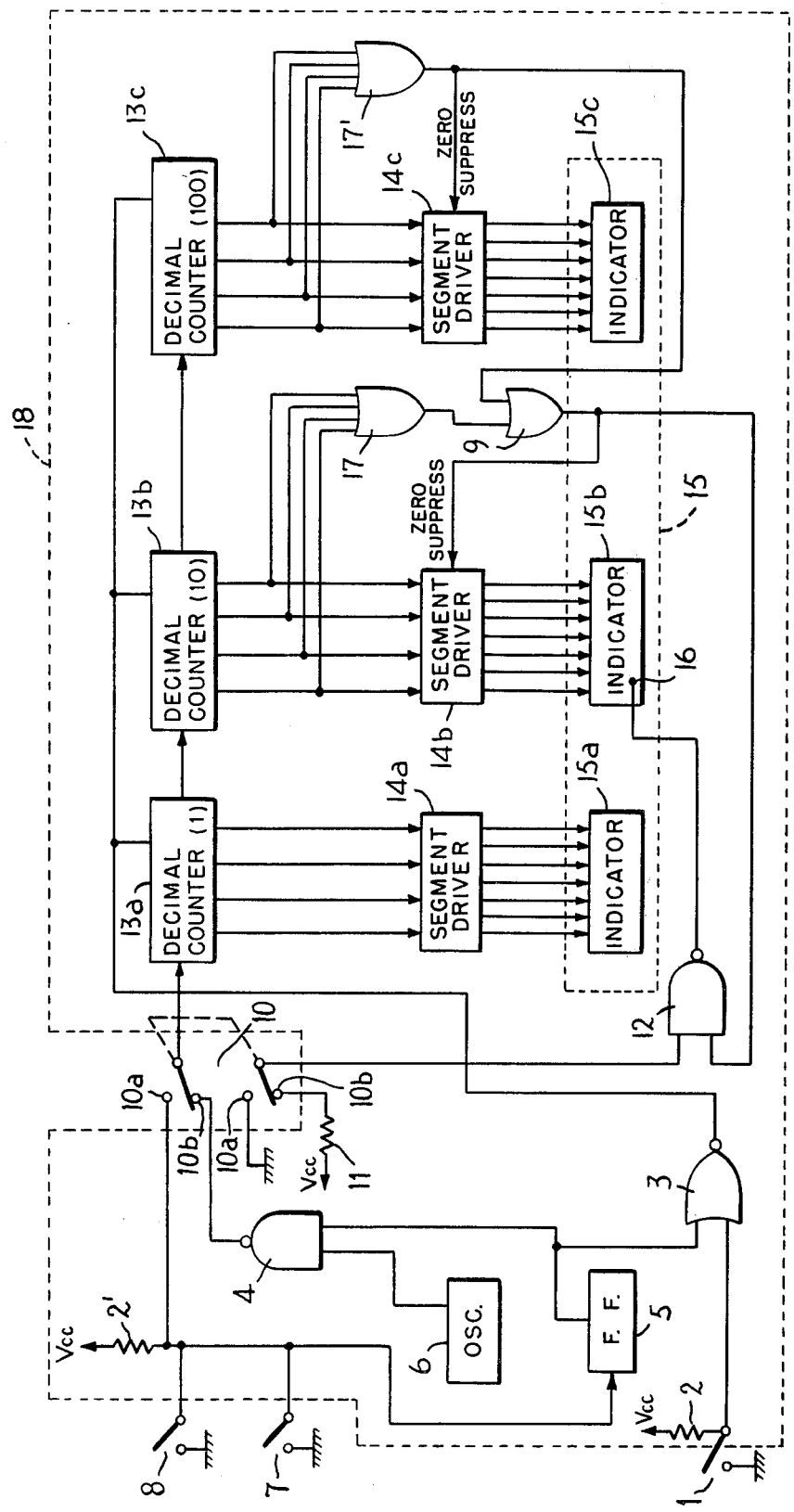
FIG. 1 shows a schematic diagram of electronic circuit used in a preferred embodiment of the invention.

Turning now to drawings, FIG. 1 shows a reset switch 1 which is usually opened and connected to the first stage of a two input NOR gate 3 and otherwise connected to a positive power supply Vcc through a resistor 2. When the reset switch 1 is opened, the first input of the said NOR gate 3 high potential (hereinafter called H). The second input terminal of NOR gate 3 is connected to the output terminal of a flip-flop circuit 5. Now assuming the said output of flip-flop to be null potential (hereinafter called L), the output of NOR gate 3 comes to H by turning reset switch 1 ON, since the above two inputs of NOR gate 3 simultaneously come to L.

The output signal H goes to reset terminals of decimal counters 13a to 13c and resets the said counters to null. In case the reset switch 1 is turned OFF, the output of NOR gate 3 is depressed to L, because one of the inputs of NOR gate 3 rises to H through the resistor 2. Therefore decimal counters 13a to 13c continue counting.

A switch 10 in the form of a double-pole double-throw switch is connected always either to decimal counters or a stop watch. When the switch 10 is closed on the terminal 10a, a clock signal input terminal of decimal counter 13a rises to H through a resistor 2'. Further when either of a push button switch 8 or marking switch 7 is only once actuated in the above condition, an L level signal is applied to the clock signal input terminal of the decimal counter 13a and consequently, the counted value of the counter 13a is increased by one. A taking-up signal of the decimal counter 13a goes to the clock signal input terminal of the decimal counter 13b, while a taking-up signal of the decimal counter 13b goes to the clock signal input terminal of the decimal counter 13c to thereby define a counter of three figures comprised of three decimal counters 13a to 13c. Outputs of decimal counters 13a to 13c are respectively connected to indicators 15a to 15c through segment drivers 14a to 14c, whereby the output values of decimal counters 13a to 13c are displayed digitally. Indicators 15a to 15c, each of which consists of seven segment display elements, are able to display all figures by the selective energized combination of the said display elements. The decimal counters 13a to 13c have respectively a four bit output, and therefore, segment drivers 14a to 14c decode the signals so as to be able to display figures corresponding to each output of decimal counters 13a to 13c on indicators 15a to 15c.

Four input OR gates 17 and 17' receive respectively four bit outputs from decimal counters 13b and 13c. When all output signals from decimal counters 13b and 13c are L, in other words the counters 13b and 13c count a null, the outputs of OR gates 17 and 17' come to be L. Consequently, a null suppressing signal input terminal on segment driver 14c connected to the OR gate 17' comes also to be L and a null signal meaning null is suppressed, wherein the indicator 15c connected with the segment driver 14c becomes completely dark and none of the figures are illuminated thereon.

Outputs from OR gates 17 and 17' go to a two input OR gate 9. When both outputs of OR gates 17 and 17' are at L level, the output of OR gate 9 comes to be L and consequently a null suppressing signal input terminal on segment driver 14b connected with OR gate 9 goes down to L. Therefore the indicator 15b connected with the segment driver 14b becomes completely dark and none of the figures are illuminated thereon.

When more than one of the four bit outputs of one of decimal counters 13b or 13c rise up to H level, the output of OR gate 17 or 17' corresponding to the said outputs rises up to H. Then the null suppressing function applied to the segment driver 14b or 14c is canceled and accordingly a counted value by the decimal counter 13b or 13c advances to the segment driver 14b or 14c so as to display a figure on the indicator 15b or 15c.

Now will be described the other main function of the present writing or marking apparatus in this connection, the apparatus can be used for counting the time duration, by connecting the switch 10 to a terminal 10b functioning as a terminal for a stop watch.

In this case, a clock signal input terminal of decimal counter 13a is connected to the output terminal of two input NAND gate 4 through the switch 10. NAND gate 4 receives both of the output signals from an oscillator 6 (in the embodiment, for example, 10 Hz frequency is selected) which continously oscillates, and from a flip-flop 5. When the output of flip-flop 5 is risen up to H level either by means of a push button switch 8 connected to the input terminal of flip-flop 5 or by a switch 7 which closes during marking, clock signals from the oscillator 6 are given to the clock signal input terminal of decimal counter 13a through the switch 10 connected to the output of the NAND gate 4.

When the outputof flip-flop 5 is depressed to L either by means of the push button switch 8 or marking switch 7, the output of NAND gate 4 rises up to H, and consequently no clock signals from the oscillator 6 are given to the decimal counter 13a.

When the push button switch 8 or the marking switch 7 is further actuated, the output of flip-flop goes to H and therefore clock signals from oscillator 6 are again given to the decimal counter 13a. In other words, the output of flip-flop 5 is repeatedly altered from L to H, or reversely, every time the push button switch 8 or the switch 7 is actuated.

When clock signals are given to the clock signal input terminal of decimal counter 13a, each device connected downstream thereof, i.e. decimal counters 13a, to 13c, segment drivers 14a to 14c, indicators 15a to 15c, OR gates 17 and 17' and OR gate 9 operates in a similar manner to that when the switch 10 is connected to the terminal 10a functioning for counting.

When the switch 10 is connected to terminals 10b for the stop watch, one of the input terminals of two input NAND gate 12 is connected to a positive power supply through the switch 10 and a resistor 11. This causes one input of NAND gate 12 to assume level H. The other input terminal receives output signals from OR gate 9. When the output of OR gate 9 is at L level, in other words, when both of the counted values by decimal counters 13b and 13c are null, a decimal point 16 in indicator 15b connected with the output terminal of NAND gate 12 receives a signal of H level, and therefore no point is displayed on the indicator. On the contrary, when the output of OR gate 9 is H, the output of NAND gate 12 goes down to L and consequently the decimal point is illuminated.

Briefly stated, the decimal point 16 is displayed only when decimal counters 13b and 13c do not simultaneously count null and further when the switch 10 is connected to the terminal 10b functioning for the stop watch. Otherwise, when the switch 10 is connected to the terminal 10a for counting, one input of NAND gate 12 is always at L level through the switch 10, so that the output of NAND gate 12 comes to be H. Consequently, the decimal point 16 is not displayed.

Figure 3:
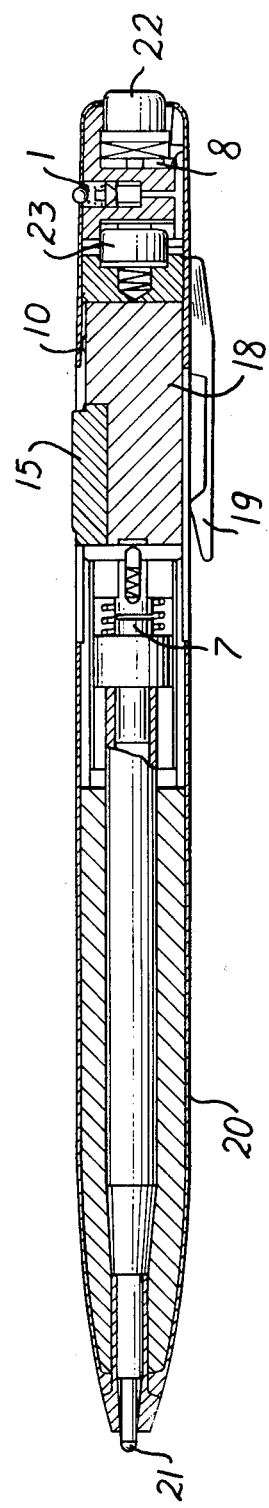
FIGS. 3 and 4 are vertical sectional views of a marking apparatus including respectively the circuitry shown in FIG. 1 and in FIG. 2.
Figure 4:
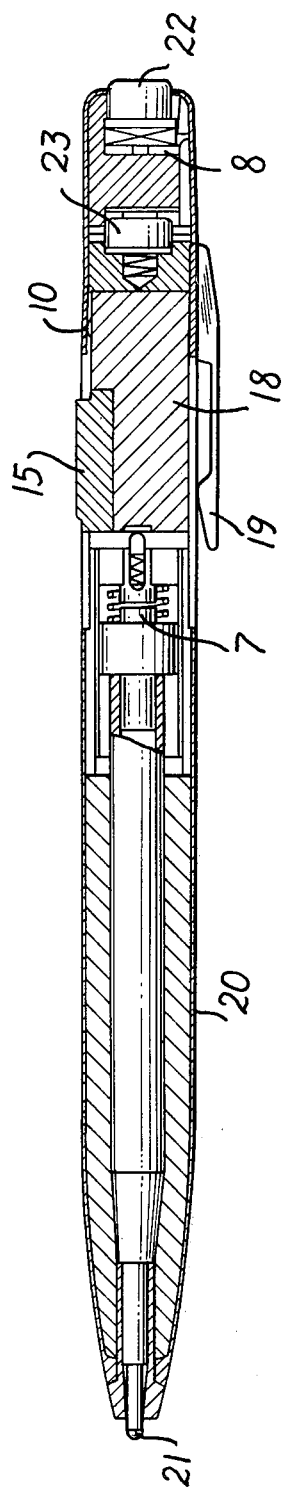

The above described resistors 2 and 2', NOR gate 3, NAND gate 4, flip-flip 5, oscillator 6, OR gate 9, resistor 11, NAND gate 12, decimal counters 13a to 13c, segment drivers 14a to 14c and OR gate 17 and 17' constitute a circuit block 18 which is contained in a case 20 as shown in FIG. 3.

Now referring to FIG. 3, a button 22 on one end of the apparatus actuates a push button switch 8, while a ball point 21 on the other end actuates a switch 7 for marking. In addition to the above described circuit, a battery 23 which supplies power to the indicator 15 which has three figures consisting of three display elements 15a to 15c and which also supplies power to the said circuit 18 is contained within the case 20 together with the said reset switch 1, button 22, push button switch 8, indicator 15, marking switch 7, ball point 21 and switch 10. Clip 19 shown on the outer surface of the case is provided for hanging or clipping the body onto the edge of pocket or the like.

Figure 2:
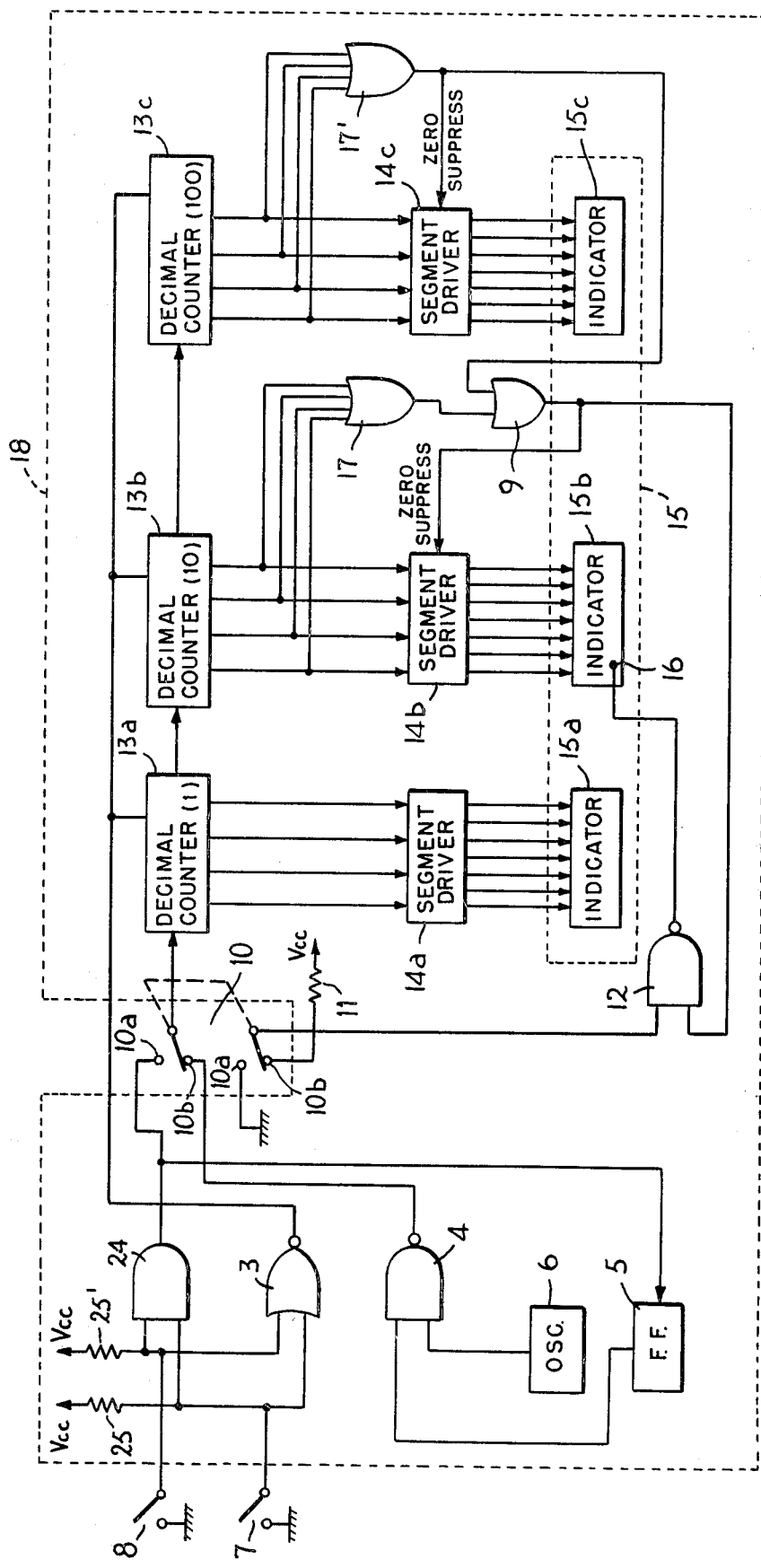
FIG. 2 is a schematic diagram of electronic circuit employed in another preferred embodiment of the invention.

With reference now to FIG. 2, another embodiment of the invention is shown and the following description for the second embodiment is limited only to the differences from the first embodiment, shown in FIG. 1.

As shown in FIG. 2, the second embodiment does not have a reset switch and thus the resetting mode differs from the first embodiment. Describing now in detail, a switch 7 for marking is connected to NOR gate 3 and one input of AND gate 24, while a push button switch 8 is connected to NOR gate 3 and the other input of AND gate 24. The output of NOR gate 3 is led to resetting terminals of decimal counters 13a to 13c. The output terminal of AND gate 24 is connected to the terminal 10a for counting and to the input terminal of flip-flop 5. The two input terminals of AND gate 24 and NOR gate 3 are led to positive power supply Vcc through resistors 25 and 25'.

When the switch 7 for marking and the push button switch 8 are both simultaneously pushed, two inputs of NOR gate 3 comes to be L and consequently the output rises up to H. Thus the resetting signals are applied to resetting terminals of decimal counters 13a to 13c. When either the switch 7 or the switch 8 is pushed, the output of NOR gate 3 is L and therefore no resetting signals are given to decimal counters 13a to 13c. At the time the output of AND gate is L, and simultaneously when an input signal is given to flip-flop 5, input signals are given to the clock signal input terminal of decimal counter 13a through the switch 10 when the switch 10 is connected to the terminal 10a for the counting mode or function. The operating mode of each device connected downstream thereof, i.e. decimal counters 13a to 13c, segment drivers 14a to 14c, display elements 15a to 15c, a decimal point 16, OR gates 9, 17 and 17', NAND gates 4 and 12, a resistor 11, a switch 10 and a oscillator 6 is similar to that of the devices shown in FIG. 1.

As above described, all circuit elements according to the present invention are contained in the case together with a battery as a power supply. The apparatus of the present invention can be used to count numerals by means of pushing a button or pressing a ball point and is otherwise available as a stop watch by means of the oscillator contained therein. Practical applications of the apparatus are not limited to counting or marking of numerals and quantities, and measuring the time duration in athletic sports, but the applications are extensive, for example, as an industrial measuring apparatus. Furthermore it is to be understood that the ball point 21 can be replaced with something to push and actuate the marking switch 7. The marking switch 7 and the push button switch 8 which are constructed as mechanical contacts in the embodiments can be also replaced with electronic switching elements.

Although the present invention has been described with particular reference to the specific details of certain embodiments, it is not intended that such details shall be regarded as limitations upon the scope of the invention except insofar as included in the accompanying claims.

We claim:

1. An apparatus for selectively counting events or timing elapsed time comprising: an elongated case configured and sized to be manually held by a person during use of the apparatus; means including an actuatable push-button switch at one end portion of said case for developing a count signal in response to each depression of said push-button switch; means within said case including an oscillator for developing continuous time signals at a frequency suitable for use as a time base; switching means mounted on said case for selectively alternatively switching the count and time signals to a common output terminal; and means within said case connected to said output terminal and responsive to count signals applied to said output terminal for counting the same and providing a corresponding numerical indication of the cumulative number count and responsive to time signals applied to said output terminal for counting the same and providing a corresponding numerical indication of the elapsed time count, said means for providing a numerical indication of the number count and elapsed time count comprising a plurality of indicators disposed about the periphery of said case, and said means for counting the count and time signals comprising a plurality of serially connected decimal counters, and a plurality of drivers each connected to receive the output of respective ones of said decimal counters and operative to generate driving signals corresponding to the outputs of the decimal counters and apply the driving signals to said plurality of indicators.

2. A marking apparatus with electronic counters comprising: a series of decimal counters; a plurality of segment drivers each connected to receive the output of one of said decimal counters and generate a driving signal in response to said output of the corresponding decimal counter; a plurality of indicators each connected to receive the driving signal from a corresponding one of said segment drivers; an oscillator operable to generate standard clock pulse signals; means including a toggle switch having two sets of contacts for selectively transmitting the clock pulses of said oscillator or other counting pulses to the clock input terminal of said decimal counters; a push-button switch connected to one set of said toggle switch contacts and operative in response to depression of said push-button switch for generating a counting pulse; a gate circuit connected between said oscillator and the other set of said toggle switch contacts and having an input terminal connected to be controlled by operation of said push-button switch for permitting the clock pulses of the oscillator to pass through said gate circuit in response to the input signal applied thereto caused by operation of said push-button switch; an actuatable reset switch; and means including a gate circuit having an input terminal connected to said reset switch and an output terminal connected to the reset terminals of said decimal counters and operative in response to actuation of said reset switch and when said push-button is not depressed to generate a reset signal to effect resetting of said decimal counters.

3. A marking apparatus with electronic counters as claimed in claim 2; wherein said apparatus has a pencil-like configuration with said push-button switch being mounted at one end thereof.

4. A marking apparatus with electronic counters comprising: a series of decimal counters; a plurality of segment drivers each connected to receive the output of one of said decimal counters and generate a driving signal in response to said output of the corresponding decimal counter; a plurality of indicators each connected to receive the driving signal from a corresponding one of said segment drivers; an oscillator operable to generate standard clock pulse signals; means including a toggle switch having two sets of contacts for selectively transmitting the clock pulses of the oscillator or other counting pulses to the clock input terminal of said decimal counters; a pair of push-button switches connected to one set of said toggle switch contacts and operative in response to depression of one of said push-button switches for generating a counting pulse; a gate circuit connected between said oscillator and the other set of said toggle switch contacts and having an input terminal connected to be controlled by operation of said push-button switches for permitting the clock pulses of the oscillator to pass through said gate circuit in response to the input signal applied thereto caused by operation of one of said push-button switches; and a two-input gate circuit having said push-button switches respectively connected to the input terminals thereof and having an output terminal connected to the reset terminals of said decimal counters whereby depression of both said push-button switches generates a reset signals at the output of said two-input gate.

5. A marking apparatus with electronic counters as claimed in claim 4; wherein said apparatus has a pencil-like configuration with one of said push-button switches being mounted on the end of an axially slidable writing or marking shaft and the other being mounted on the end of the apparatus body.

* * * * *